United States Patent
Ozeki et al.

(12) 
(10) Patent No.: US 6,346,835 B1
(45) Date of Patent: *Feb. 12, 2002

(54) POWER-ON RESET SIGNAL PREPARING CIRCUIT

(75) Inventors: Yoshitomo Ozeki; Hiroyuki Adachi, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/538,228

(22) Filed: Mar. 30, 2000

(30) Foreign Application Priority Data

Sep. 2, 1999 (JP) .......................... 11-248936

(51) Int. Cl.[7] ................................. H03L 7/00
(52) U.S. Cl. ..................................... 327/143
(58) Field of Search ................... 327/142, 143

(56) References Cited

U.S. PATENT DOCUMENTS

| | | | | |
|---|---|---|---|---|
| 4,142,118 A | * | 2/1979 | Guritz | 307/358 |
| 5,144,159 A | * | 9/1992 | Frisch et al. | 307/272.3 |
| 5,214,316 A | * | 5/1993 | Nagai | 307/272.3 |
| 5,677,643 A | * | 10/1997 | Tomita | 327/78 |
| 5,770,959 A | * | 6/1998 | Hopkins et al. | 327/143 |
| 5,929,674 A | * | 7/1999 | Maccarrone et al. | 327/143 |
| 6,087,866 A | * | 7/2000 | Prucklmayer | 327/143 |

FOREIGN PATENT DOCUMENTS

| | | |
|---|---|---|
| JP | 4-179183 | 6/1992 |
| JP | 8-036442 | 2/1996 |
| JP | 9-307416 | 11/1997 |

* cited by examiner

Primary Examiner—Jeffrey Zweizig
(74) Attorney, Agent, or Firm—Armstrong, Westerman, Hattori, McLeland & Naughton, LLP (57) ABSTRACT

A power-on reset signal preparing circuit including a pulse width preparing circuit for generating a pulse for resetting a main circuit based on a driving voltage output from a driving circuit based on the output voltages from two charging circuits with different charging times. The driving circuit may be a switching circuit utilizing charged potential difference of the two charging circuits, a gate circuit utilizing a charging time difference of the two charging circuits, or a differential transistor pair utilizing the charging potential difference or time difference of the two charging circuits. The pulse width preparing circuit may be formed by two wiring lines, connected between the output of the driving circuit and the ground and running substantially parallel to each other, whereby the capacitors may be small in size.

5 Claims, 6 Drawing Sheets

POWER-ON RESET SIGNAL PREPARING CIRCUIT

BACKGROUND OF THE INVENTION

1. Field of the Invention

The present invention relates to a power-on reset signal preparing circuit for generating a reset signal in response to the appearance of a power supply voltage. More particularly, the present invention relates to a power-on reset signal preparing circuit for generating a reset signal for resetting a main circuit in, for example, a microprocessor after a power supply voltage is stabilized after turning on of the power supply of the main circuit.

In general, most microprocessors include power-on reset signal preparing circuits for preparing reset signals in response to the appearance of their power supply voltages.

2. Description of the Related Art

Figure 8:
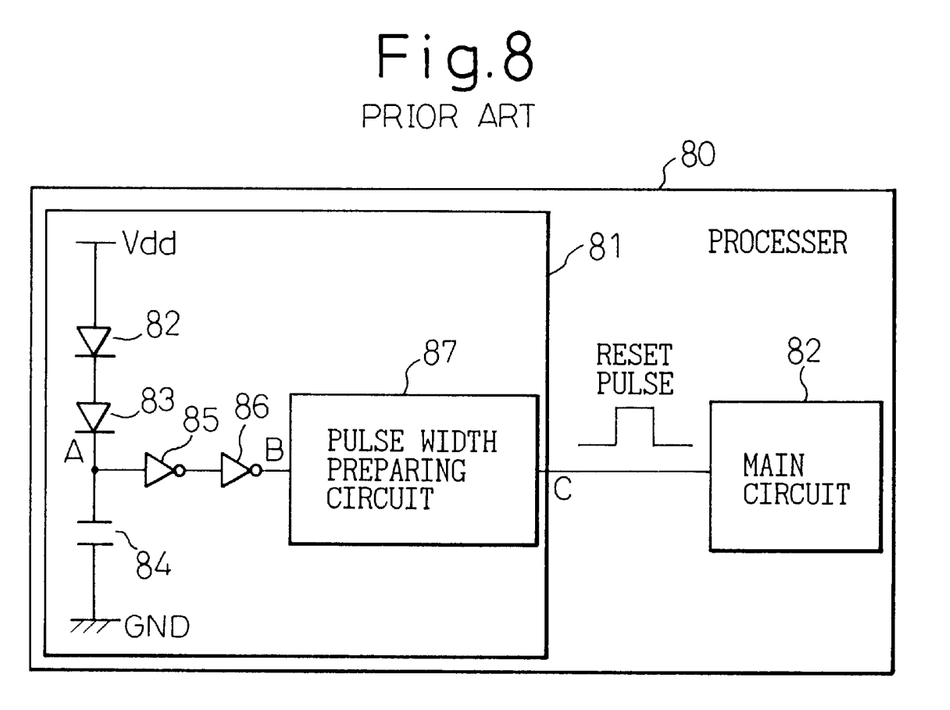
FIG. 8 is a circuit diagram showing the construction of a processor including an example of a conventional power-on reset signal preparing circuit.

FIG. 8 is a circuit diagram showing a processor which includes an example of a conventional power-on reset signal preparing circuit. In the figure, a processor 80 includes a power-on reset signal preparing circuit 81 and a main circuit 82 connected to the circuit 81. The power-on reset signal preparing circuit 81 includes a charging circuit consisting of diodes 82 and 83 connected in series between a power supply line Vdd and the ground GND, and a pulse width preparing circuit 87 connected through inverter gates 85 and 86 to the output of the charging circuit.

Figure 9:
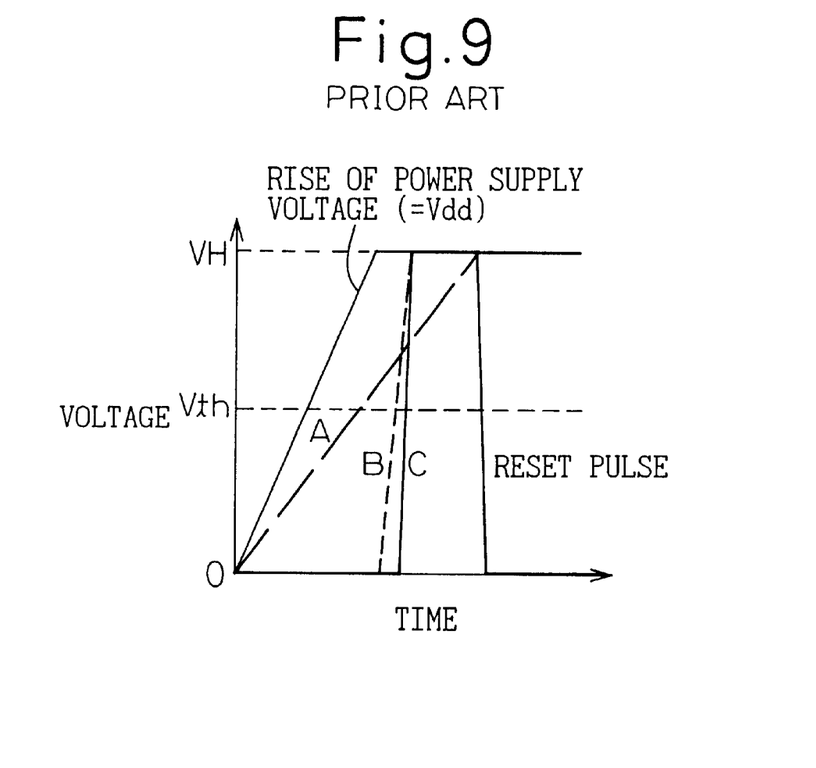
FIG. 9 is a voltage waveform diagram for explaining the operation of the circuit shown in FIG. 8.

FIG. 9 is a voltage waveform diagram for explaining the operation of the power-on reset signal preparing circuit 81. As shown in the figure, due to a rise of the power supply voltage, also denoted by the symbol Vdd, from 0 volts to VH, the capacitor 84 is charged up so that the voltage at a point A rises from 0 volts. When the voltage at the point A exceeds a predetermined threshold Vth, the inverter gates 85 and 86 are enabled to operate so that a voltage at a point B rises from 0 volts to VH. The pulse width preparing circuit receives this voltage to prepare a reset pulse. This reset pulse is supplied to the main circuit 82 to reset it so as to avoid an unstable operation of the main circuit 82 during the rise of the power supply voltage.

Figure 10:
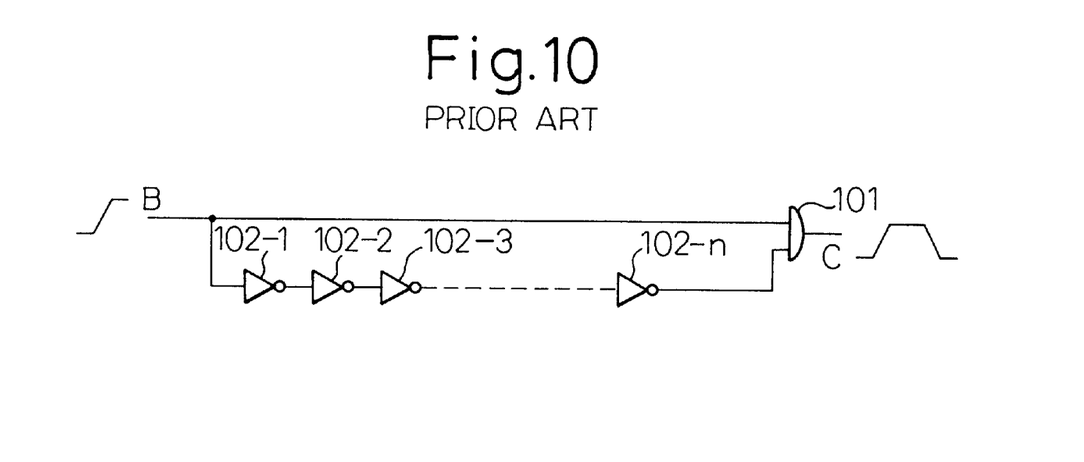
FIG. 10 is a diagram showing an example of a conventional pulse width preparing circuit.

FIG. 10 is a diagram showing an example of the conventional pulse width preparing circuit 87. As shown in the figure, a signal from the point B is, in one hand, directly supplied to one of the inputs of an AND gate 101, and is, on the other hand, supplied to the other of the inputs of the AND gate 101 through odd number of inverters 102-1, 102-2, . . . , and 102-n. By this arrangement, a power-on reset signal having a certain width with an edge at the rise of the voltage at the point B can be obtained at the output C of the pulse width preparing circuit 87.

In the above-mentioned conventional technique, however, when the capacity of the capacitor 84 is too small, the signal at the point A rises too fast in response to the rise of the power supply voltage so that a signal may arrive at the input of the inverter gate 85 before the next stage inverter gates are enabled to operate so that the desired edge may not be transferred to the next stage. In this case, there is a problem in that the next stage cannot prepare the reset pulse. If the capacity of the capacitor 84 is increased, the above-mentioned problem will be eliminated, however, the size of the capacitor will become large, and therefore, this tactic does not meet the requirement of miniaturizing the size of the circuit.

To avoid this, a detailed adjustment of fine circuit constants is necessary by taking the capacities of capacitors included in the circuit and the rise time of the power supply voltage into account. When the rise time of the power supply voltage takes 10 milliseconds plus several milliseconds, there is a problem in that it is difficult to form the circuit into an LSI.

In addition, since the conventional pulse width preparing circuit must generate a delay by using a large number of stages of inverter gates, there is a problem in that a large physical area is necessary. Still further, when the polarity of the pulse signal must be changed, the circuit design must also be changed, so that there is a problem in that the circuit lacks flexibility. Still further, since the delay times in the gates vary depending on the manufacturing conditions, there is a problem in that the pulse width of the power-on reset signal also varies depending on the various delay times.

SUMMARY OF THE INVENTION

In view of the above problems in the prior art, an object of the present invention is to provide a power-on reset signal preparing circuit which can surely prepare a reset pulse even when a capacitor of a small size is used.

Another object of the present invention is to provide a power-on reset signal preparing circuit which requires a small physical area, does not require a circuit for changing the polarity of the pulse signal, and has a pulse width preparing circuit with a small variation of the pulse width.

To attain the above objects, there is provided, according to the present invention, a power-on reset signal preparing circuit comprising two charging circuits having different charging times when the same power supply voltage is applied, a driving circuit for outputting a driving voltage based on the output voltages from the two charging circuits, and a pulse width preparing circuit for generating a reset pulse to reset a main circuit based on the driving voltage output from the driving circuit.

Since the pulse width preparing circuit is driven based on the output voltage from the two charging circuits, the reset pulse is surely generated and the capacities of the capacitors constructing the two charging circuits may be small. Therefore, the power-on reset signal preparing circuit according to the present invention meets the requirement regarding the size of the circuit.

According to one aspect of the present invention, the driving circuit is a switching means which is turned on to supply a driving voltage to the pulse width preparing circuit when the difference between the output voltages from the two charging circuits exceeds a predetermined value after applying a power supply voltage to the power-on reset signal preparing circuit.

According to another aspect of the present invention, the driving circuit is a gate means which supplies a driving voltage to the pulse width preparing circuit when both of the output voltages from the two charging circuits reach a predetermined threshold after applying a power supply voltage to the power-on reset signal preparing circuit.

According to still other aspect of the present invention, the pulse width preparing circuit is formed by two wiring lines connected to the output of the driving circuit and to the earth and running substantially parallel to each other.

By changing the length of the parallel lines, the area required for the pulse width preparing circuit may be smaller than that in the case of forming the pulse width preparing circuit by gates.

BRIEF DESCRIPTION OF THE DRAWINGS

The above objects and features of the present invention will be more apparent from the following description of the preferred embodiments when read with reference to the accompanying drawings, wherein.

DESCRIPTION OF THE PREFERRED EMBODIMENTS

In the following, embodiments of the present invention will be described with reference to the drawings.

Figure 1:
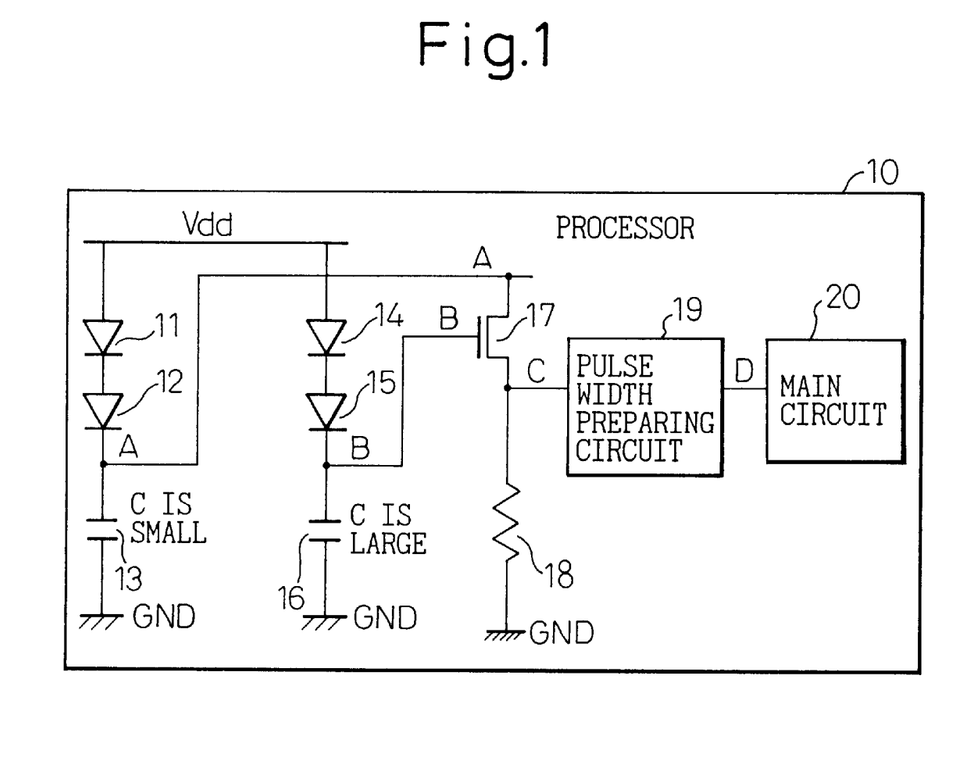
FIG. 1 is a circuit diagram showing the construction of a processor including a power-on reset signal preparing circuit according to a first embodiment of the present invention.

FIG. 1 is a circuit diagram showing the construction of a processor including a power-on reset signal preparing circuit according to a first embodiment of the present invention. In the figure, diodes 11 and 12 connected in series between a power supply voltage line Vdd and the ground GND and a first capacitor 13 form a first charging circuit. Similarly, diodes 14 and 15 connected in series between the power supply voltage line Vdd and the ground GND and a second capacitor 16 form a second charging circuit. According to the present invention, the capacity of the first capacitor is set to be relatively small, and the capacity of the second capacitor is set to be relatively large. An N channel metal oxide semiconductor (MOS) transistor 17 and a resistor 18 form a driving circuit for driving a pulse width preparing circuit 19. The output of the first charging circuit, i.e., a connecting point A between the capacitor 13 and the diode 12, is connected to the source of the transistor 17. The output of the second charging circuit, i.e., a connecting point B between the capacitor 16 and the diode 15, is connected to the gate of the transistor 17. The resistor 18 is connected between the source of the transistor 17 and the ground GND. A connecting point C between the source of the transistor 17 and the resistor 18 is connected to the input of the pulse width preparing circuit 19. The output D of the pulse width preparing circuit 19 is connected to the input of the main circuit 20 in the processor 10.

Figure 2:
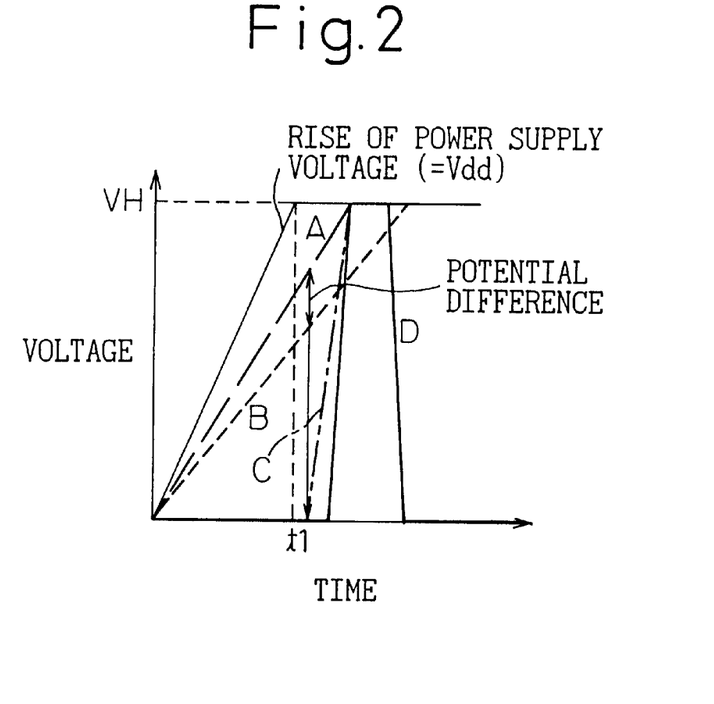
FIG. 2 is a voltage waveform diagram for explaining the operation of the circuit shown in FIG. 1.

FIG. 2 is a voltage waveform diagram for explaining the operation of the circuit shown in FIG. 1. As shown in the figure, due to a rise of the power supply voltage from 0 volts to Vdd, the capacitors 13 and 16 are charged so that the voltage at the point A and the voltage at the point B rise from 0 volts. Since the capacity of the capacitor 13 is relatively small, and the capacity of the capacitor 16 is relatively large, the voltage at the point A rises quickly, and the voltage at the point B rises slowly. As a result, the potential difference between the drain and the gate of the transistor 17 is increased along with the lapse of time. When the potential difference exceeds the threshold of the transistor 17, it conducts current to increase the potential at a point C connected to the drain of the transistor 17. In response to the appearance or rise of the potential at the point C, the pulse width preparing circuit 19 is driven to form a reset pulse at its output D. In this way, according to this embodiment of the present invention, the power-on reset signal preparing circuit is realized by utilizing the potential difference between the points A and B.

It should be noted that the capacities of the capacitors 13 and 16 are set in such a way that the potential difference between the points A and B exceeds the threshold of the transistor 17 after the power supply voltage Vdd reaches the high level VH.

As long as the above condition is satisfied, the capacity of the capacitor 13 and the capacity of the capacitor 16 may be as small as possible. Therefore, the size of the capacitor may be much smaller than that in the conventional power-on reset signal preparing circuit. Consequently, the miniaturization of the processor can be promoted.

Further, the fine adjustment of the circuit constants, which has been done in the prior art by taking the capacities of the capacitors and the rise time of the power supply voltage into account, becomes unnecessary according to this embodiment of the present invention. As a result, the circuit can be easily formed into an LSI.

It should be noted that, instead of the N channel MOS transistor 17 in the circuit shown in FIG. 1, a P channel MOS transistor may also be employed to provide the same effects as above.

Figure 3:
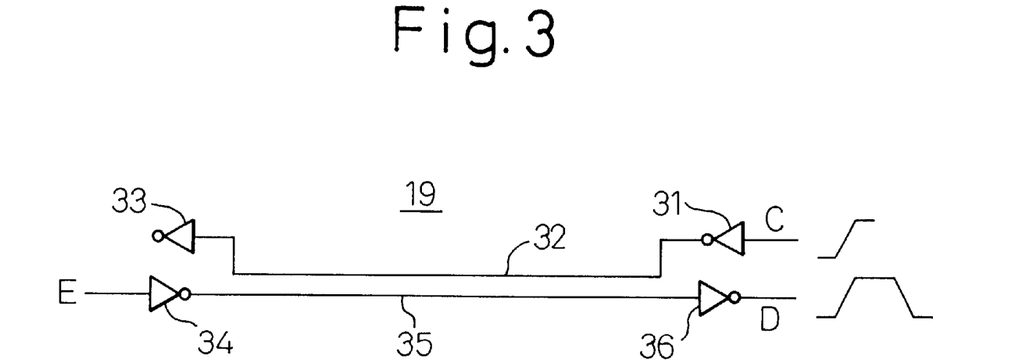
FIG. 3 is a circuit diagram showing the construction of a pulse width preparing circuit according to a second embodiment of the present invention.

FIG. 3 is a circuit diagram showing the construction of the pulse width preparing circuit 19 according to a second embodiment of the present invention. In the figure, the pulse width preparing circuit 19 includes an inverter 31 having an input connected to the point C connected to the source of the transistor 17 in the circuit shown in FIG. 1, a wiring line 31 connected to the output of the inverter 31, an inverter 33 having an input connected to the end of the wiring line 32, an inverter 34 having an input connected to a point E which is connected to a fixed voltage source (not shown), a wiring line 35 running substantially in parallel with the wiring line 32, and an inverter 36 having an input connected to the end of the wiring line 35 and having an output connected to a point D which is connected to the output of the pulse width preparing circuit 19 in the circuit shown in FIG. 1.

According to this embodiment, a pulse is prepared by using coupling noise between signals. It is known that, in wiring lines running in parallel, the delay of a signal on one of the wiring lines is twice the delay of a signal on another one of the wiring lines. Therefore, when a signal having a certain pulse width is applied to the inverter 31 connected to the wiring line 32, a signal, the pulse width of which is twice the above-mentioned certain pulse width, can be obtained at the output D of the inverter 36 connected to the other wiring line 35. By changing the lengths of the parallel wiring lines 32 and 35, the pulse width can be adjusted.

According to this embodiment, multiple-stage gates are not necessary so that the pulse width preparing circuit can be formed in a small area. Further, since the polarity of the pulse signal can be easily changed by changing the polarity of the signal applied to the point E or by changing the polarity of the switching signal applied to the point C, it is not necessary to reconstruct the circuit even when the polarity of the pulse signal to be obtained at the point D has to be changed. Still further, since the variations in the resistances and the capacities of the wiring lines are generally smaller than the variations in the delays in the gates, the variation in the pulse widths can be made small.

Figure 4:
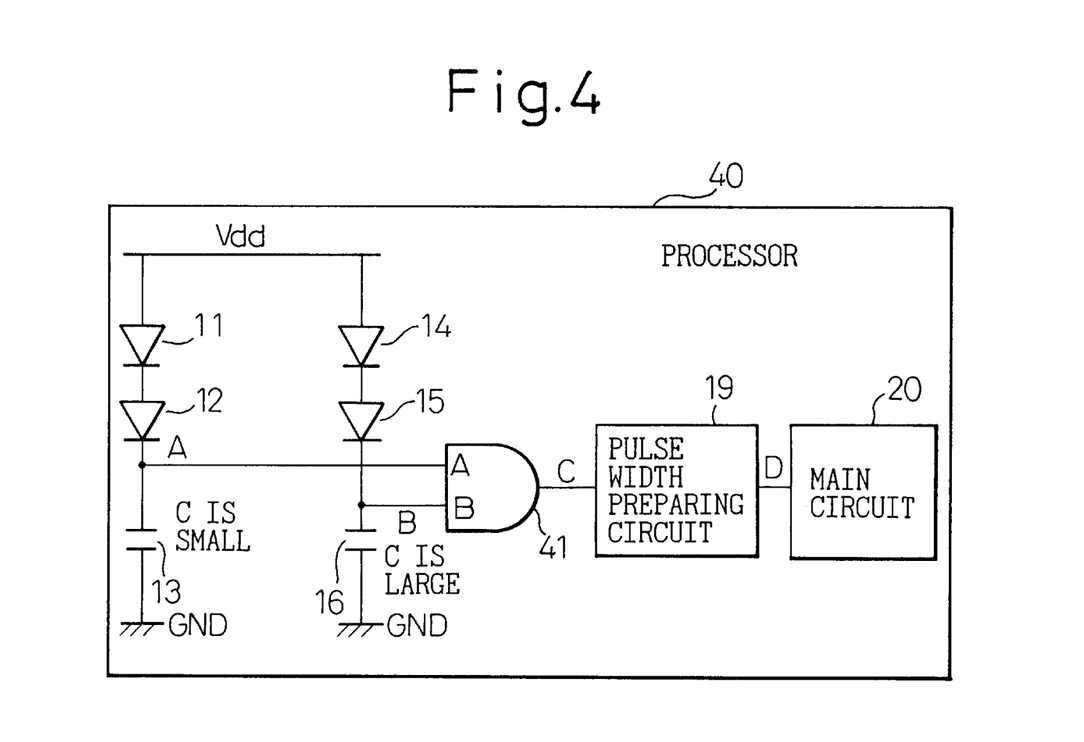
FIG. 4 is a circuit diagram showing the construction of a processor including a power-on reset signal preparing circuit according to a third embodiment of the present invention.

FIG. 4 is a circuit diagram showing the construction of a processor including a power-on reset signal preparing circuit according to a third embodiment of the present invention. In the figure, the same reference numerals as in FIG. 1 represent the same parts. In this embodiment, in place of the transistor 17 and the resistor 18 in FIG. 1, an AND gate is employed. The other portions are the same as those in FIG. 1. The point A is connected to one of the inputs of the AND gate 41. The point B is connected to the other of the inputs of the AND gate 41.

Figure 5:
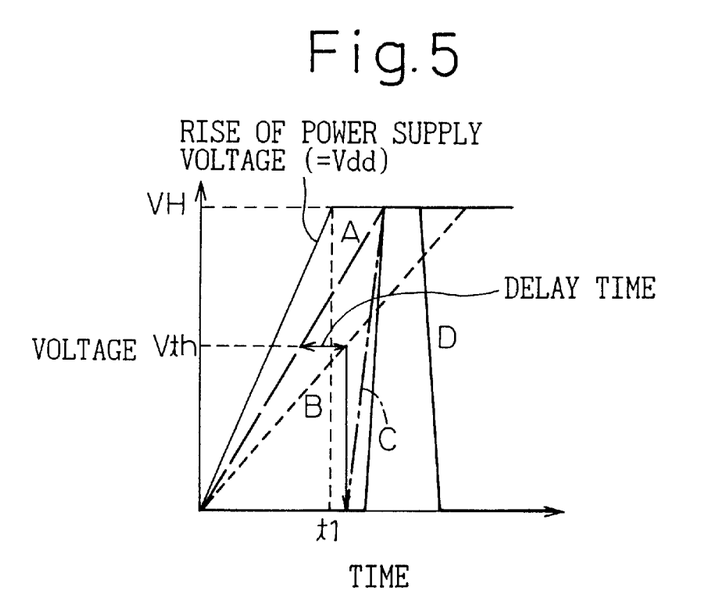
FIG. 5 is a voltage waveform diagram for explaining the operation of the circuit shown in FIG. 4.

FIG. 5 is a voltage waveform diagram for explaining the operation of the circuit shown in FIG. 4. As shown in the figure, due to a rise of the power supply voltage from 0 volts to Vdd, the capacitors 13 and 16 are charged so that the voltage at the point A and the point B rise from 0 volts. Since the capacity of the capacitor 13 is relatively small and the capacity of the capacitor 16 is relatively large, the potential at the point A rises quickly, and the potential at the point B rises slowly. As a result, the voltage at the point A at first reaches the threshold voltage of the AND gate 41, and then after a certain delay time, the voltage at the point B reaches the threshold voltage of the AND gate 41. When both of the voltages at the points A and B exceed the threshold voltage, the output C of the AND gate 41 is turned to the high level. In response to the high level signal as a rising edge, the pulse width preparing circuit 19 is driven to generate a reset pulse at the output D. In this way, according to this embodiment, the power-on reset signal preparing circuit is realized by using the time difference between the voltage rises.

It should be noted that the capacities of the capacitors 13 and 16 are set in such a way that the potential at the point B exceeds the threshold of the AND gate 41 only after the power supply voltage Vdd reaches the high level VH.

As long as the above-mentioned condition is satisfied, the capacities of the capacitors 13 and 16 may be as small as possible. Therefore, the size of the capacitor can be made small in comparison with the capacitors in the prior art power-on reset signal preparing circuit, so that the miniaturization of the processor can be promoted.

Further, the fine adjustment of the circuit constants, which has been done in the prior art by taking the capacities of the capacitors and the rise time of the power supply voltage into account, becomes unnecessary according to this embodiment of the present invention. As a result, the circuit can be easily formed into an LSI.

In this embodiment also, as the pulse width preparing circuit 19, the circuit shown in FIG. 3 may be employed.

Figure 6:
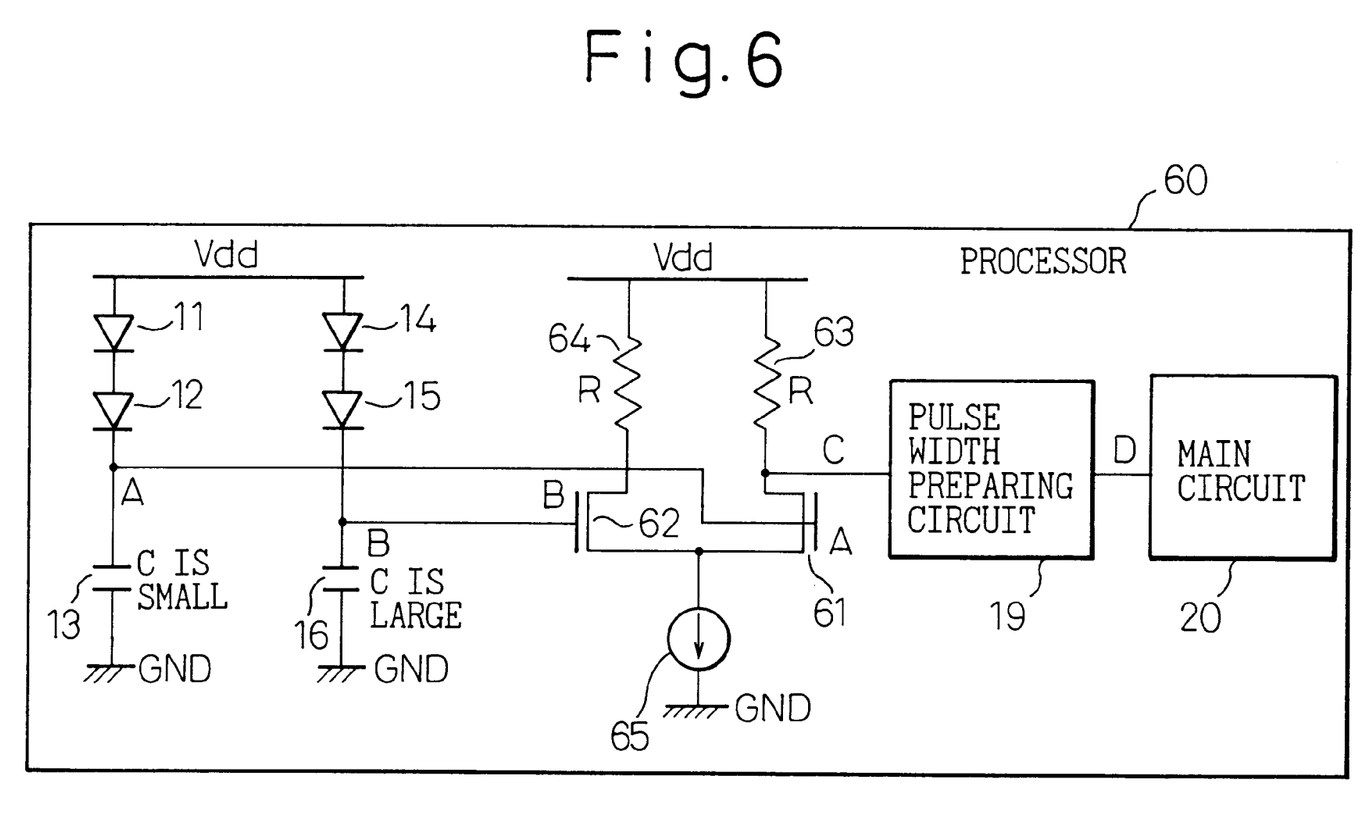
FIG. 6 is a circuit diagram showing the construction of a processor including a power-on reset signal preparing circuit according to a fourth embodiment of the present invention.

FIG. 6 is a circuit diagram showing the construction of a processor including a power-on reset signal preparing circuit according to a fourth embodiment of the present invention. In the figure, the same reference numerals as those in FIG. 1 represent the same parts. In this embodiment, in place of the transistor 17 and the resistor 18 in FIG. 1, a differential amplifier including a pair of differential transistors 61 and 62 and a constant current source 65 is employed. The other portions are the same as those in FIG. 1. The point A is connected to the gate of an N channel MOS transistor 61. The point B is connected to the gate of an N channel MOS transistor 62. The drains of the transistors 61 and 62 are connected through resistors 63 and 64 respectively to the power supply voltage line Vdd. The sources of the transistors 61 and 62 are connected through a constant current source 65 to the ground.

Figure 7:
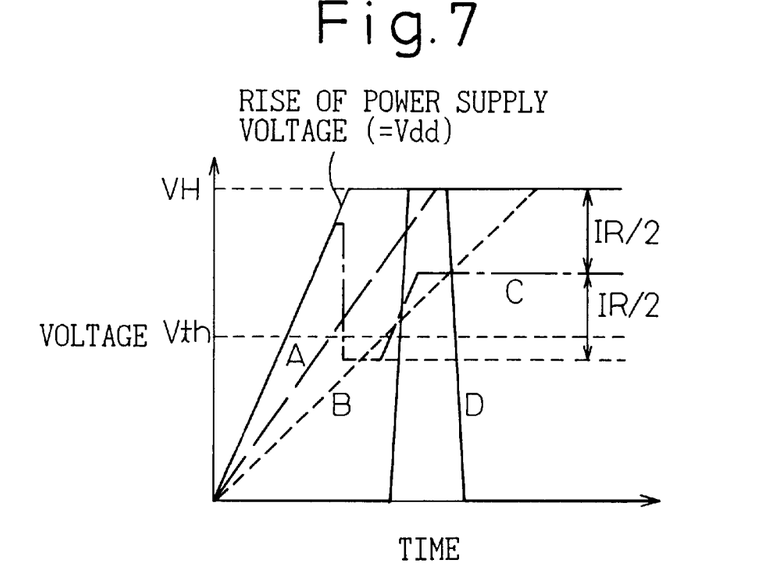
FIG. 7 is a voltage waveform diagram for explaining the operation of the circuit shown in FIG. 6.

FIG. 7 is a waveform diagram for explaining the operation of the circuit shown in FIG. 6. As shown in the figure, due to a rise of the power supply voltage from 0 volts to vdd, the capacitors 13 and 16 are charged to raise the voltage at the points A and B from 0 volts. Since the capacity of the capacitor 13 is relatively small, and the capacity of the capacitor 16 is relatively large, the voltage at the point A rises quickly and the voltage at the point B rises slowly.

As a result, at first, the voltage at the point A reaches the threshold voltage Vth of the transistor 61 to turn on the transistor so that the voltage at the output point C of the differential amplifier is lowered. Then, a certain time later, the voltage at the point B reaches the threshold Vth of the transistor 62 to turn on the transistor. When both of the transistors 61 and 62 are turned on, the same current flows through the transistors 61 and 62 due to the function of the constant current source 65. As a result, the potential at point C rises. The pulse width preparing circuit 19 is driven in response to the rise of the potential at the point C as a rising edge to form a reset pulse at the output D.

It should be noted that the capacities of the capacitors 13 and 16 are set in such a way that the potential at the point A exceeds the threshold of the transistor 61 only after the power supply voltage Vdd reaches the high level VH.

As long as the above-mentioned condition is satisfied, the capacities of the capacitors 13 and 16 may be as small as possible. Therefore, the sizes of the capacitors may be much smaller than that in the conventional power-on reset signal preparing circuit. Consequently, the miniaturization of the processor can be promoted.

Further, since the fine adjustment of the circuit constants, which has been done in the prior art by taking the capacities of the capacitors and the rise time of the power supply voltage into account, becomes unnecessary according to this embodiment of the present invention. As a result, the circuit can be easily formed into an LSI.

In this embodiment also, the circuit shown in FIG. 3 may be employed as the pulse width preparing circuit 19.

It should be noted that, instead of the N channel MOS transistors 61 and 62, P channel MOS transistors may also be employed to provide the same effects as above.

What is claimed is:

1. A power-on reset signal preparing circuit comprising:
   two charging circuits, each comprising at least a diode and a capacitor, having different charging times when the same power supply voltage is applied to said two charging circuits;
   a driving circuit for outputting a driving voltage based on the output voltages from said two charging circuits; and
   a pulse width preparing circuit for generating a reset pulse for resetting a main circuit based on the driving voltage output from said driving circuit.

2. The power-on reset signal preparing circuit as claimed in claim 1, wherein said driving circuit is a switching means which is turned on when the difference between the output voltages from said two charging circuits exceeds a predetermined value after applying said power supply voltage, to supply the driving voltage to said pulse width preparing circuit.

3. The power-on reset signal preparing circuit as claimed in claim 1, wherein said driving circuit is a gate means for supplying the driving voltage to said pulse width preparing circuit when both of the output voltages from said two charging circuits reach a predetermined threshold after applying said power supply voltage.

4. The power-on reset signal preparing circuit as claimed in claim 1, wherein said driving circuit is a pair of differential transistors respectively operated in response to the output voltages from said two charging circuits, said driving voltage being formed by passing a current through one of said pair of differential transistors and then, after a predetermined time, by passing a current through another one of said pair of differential transistors, said driving voltage being applied to said pulse width preparing circuit.

5. The power-on reset signal preparing circuit as claimed in claim 1, wherein said pulse width preparing circuit is formed by two wiring lines connected between the output of said driving circuit and the ground and running substantially parallel to each other.

* * * * *